United States Patent [19]

Higuchi

[11] 4,092,172

[45] May 30, 1978

[54] PHOTOCURABLE COMPOSITION COMPRISING A COPOLYMER OF A MALEIC ACID MONOESTER WITH AN α-OLEFINE

[75] Inventor: Tetsuo Higuchi, Hiratsuka, Japan

[73] Assignee: Kansai Paint Co., Ltd., Japan

[21] Appl. No.: 646,012

[22] Filed: Jan. 2, 1976

[30] Foreign Application Priority Data

Aug. 22, 1975 Japan .................................. 50-101817
Nov. 22, 1975 Japan .................................. 50-140430

[51] Int. Cl.² ................................................ G03C 1/68
[52] U.S. Cl. ....................................... 96/115 P; 96/33; 96/35.1; 96/115 R; 204/159.15
[58] Field of Search ............... 96/115 R, 115 P, 35.1, 96/33; 204/159.14, 159.15, 159.16; 260/89.3

[56] References Cited

U.S. PATENT DOCUMENTS

| 3,658,531 | 4/1972 | Kurtz ............................ 96/115 R X |
| 3,674,745 | 7/1972 | Phlipot et al. ................ 96/115 R X |
| 3,695,877 | 10/1972 | Taneda et al. ...................... 96/35.1 |
| 3,782,961 | 1/1974 | Takahashi et al. ................ 96/115 R |
| 3,825,430 | 7/1974 | Kurka ............................... 96/115 R |
| 3,854,946 | 12/1974 | Sayigh et al. ................. 96/115 R X |
| 3,864,133 | 2/1975 | Hisamatsu et al. ............ 96/115 R X |
| 3,928,299 | 12/1975 | Rosenkranz et al. ............... 96/33 X |
| 3,948,665 | 4/1976 | Richter et al. ..................... 96/115 R |
| 3,951,657 | 4/1976 | Recchia et al. ....................... 96/33 X |

*Primary Examiner*—Edward C. Kimlin
*Attorney, Agent, or Firm*—Ostrolenk, Faber, Gerb & Soffen

[57] ABSTRACT

A photocurable composition comprising a copolymer of maleic acid monoester with α-olefine compound, a vinylurethane compound obtained by urethanation reaction of a polyisocyanate compound with a photopolymerizable ethylenically unsaturated alcohol having a number average molecular weight of less than 3,000 or by urethanation reaction of 1 mole of diisocyanate compound with about 1 mole of the photopolymerizable ethylenically unsaturated alcohol and about 1/m mole of m-valent alcohol (wherein $m$ is an integer of 2 to 6) having a number average molecular weight of less than 3,000, and a photosensitizer.

11 Claims, No Drawings

PHOTOCURABLE COMPOSITION COMPRISING A COPOLYMER OF A MALEIC ACID MONOESTER WITH AN α-OLEFINE

BACKGROUND OF THE INVENTION

This invention relates to a photocurable composition and, more particularly, to a photocurable composition which is especially suitable for forming printing plates.

As a photocurable composition for forming printing plates in the conventional art, there has been, for example, proposed and disclosed in the Japanese Pat. No. 265544 a photocurable composition comprising a high molecular material, a polymerizable ethylenically unsaturated compound and a photosensitizer which is applied or molded onto a substrate to obtain a solid state relief image forming layer at room temperature. Said relief image forming layer is cured by the application of actinic rays and then the un-cured portion is washed away with aqueous alkali solution to obtain the desired printing plate.

Although said high molecular materials such as cellulose derivatives having oxyacid groups, acrylic polymer having oxyacid group and acidic polyvinyl alcohol have two characteristics that make it possible to keep the photocurable composition in the solid state at room temperature and that can allow the un-cured photocurable composition to wash away by using an aqueous alkali solution, they have poor compatibility with the polymerizable ethylenically unsaturated compound and reduce the photopolymerization velocity at the time of forming printing plate. Further, the printing plate obtained is inferior in respect of several properties such as toughness, flexibility, stiffness, abrasion resistance and water resistance.

In the meantime, as the polymerizable ethylenically unsaturated compound, there is, for example, an unsaturated resin, so to speak "acryl-urethane resin" which is disclosed in Japanese Patent Publication No. 43657/1973. Said acryl-urethane resin itself is excellent in mechanical and chemical properties such as abrasion resistance, adhesion, solvent resistance and curing property which is not effected very much by atmospheric oxygen.

Accordingly, in the conventional art, it was possible by mere incorporating the high molecular material into the acrylurethane resin which is in the liquid state at room temperature to obtain the photocurable composition having the foregoing two characteristics, however, the resulting photocurable composition was unable to make use of the above-mentioned features of the acryl-urethane resin thoroughly, so that the photocurable composition was also not always satisfactory in several properties such as curing property, abrasion resistance, adhesion and solvent resistance.

BRIEF SUMMARY OF THE INVENTION

In order to eliminate the above-mentioned disadvantages in the conventional art, the inventors of the present invention have carried out eager and extensive studies on a photocurable composition which is cured by the application of actinic rays and can be developed by organic solvent or aqueous alkaline solution.

It is therefore an object of the present invention to provide a photocurable composition which is in the solid state at room temperature and is curable by the application of actinic rays and can be developed by organic solvent or aqueous alkali solution.

It is further object of the present invention to provide a photocurable composition having excellent photocurability in that curing reaction is not inhibited by atmospheric oxygen.

It is still further object of the present invention to provide a photocurable composition which is excellent in mechanical properties such as toughness, flexibility, stiffness and abrasion resistance.

It is further another object of the present invention to provide a photocurable composition which is excellent in compatibility, adhesion, solvent resistance and water resistance.

According to the present invention, there is provided a photocurable composition which comprises a copolymer of maleic acid monoester with α-olefine compound, a vinylurethane compound obtained by urethanation reaction of a polyisocyanate compound with a photopolymerizable ethylenically unsaturated alcohol having a number average molecular weight of less than 3,000 or by urethanation reaction of 1 mole of diisocyanate compound with about 1 mole of the photopolymerizable ethylenically unsaturated alcohol and about 1/m mole of m-valent alcohol (wherein $m$ is an integer of 2 to 6) having a number average molecular weight of less than 3,000, and a photosensitizer.

DETAILED DESCRIPTION OF THE INVENTION

The copolymer of maleic acid monoester with α-olefine compound (hereinafter referred to as "α-olefine copolymer") used in the present invention is represented by the following formula:

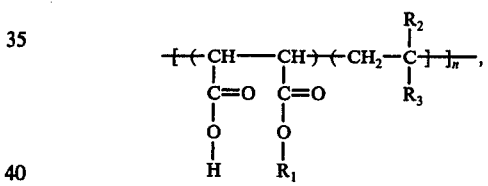

wherein $R_1$ is an alkyl group having 1 to 8 carbon atoms, allyl group, aralkyl group, cyclo group and cycloalkyl group, $R_2$ is a hydrogen or alkyl group of 1 to 3 carbon atoms, $R_3$ is a hydrogen or alkyl group of 1 to 6 carbon atoms and $n$ is an ingeger which makes the number average molecular weight about 40,000 to about 200,000. Preferable examples of $R_1$ are methyl, ethyl, n-butyl, n-hexyl, allyl, cyclohexyl and tetrahydrofurfuryl group. The α-olefine compounds are those having straight chain or branched chain structure of 2 to 8, preferably 2 to 6, carbon atoms. Examples thereof are, for example, ethylene, propylene, n-butene, isobutylene, n-pentene, isoprene, 2-methyl 1-butene, n-hexene, 2-methyl 1-pentene, 3-methyl 1-pentene, 4-methyl 1-pentene, 2-ethyl 1-butene and the like. Of these, isobutylene is especially preferred.

In order to obtain the α-olefine copolymer, a copolymer of maleic anhydride with α-olefine compound should be mixed with alcohol having the above-mentioned $R_1$ group in greater amount than that of the copolymer, followed by a half-esterification reaction. If necessary, there may be added one or more conventional esterification catalysts such as pyridine, picoline, tertiary amines (for example triethyl amine), p-toluenesulfonic acid, sulfuric acid and the like.

In addition to this, there may be used a method where copolymerization of a maleic acid monoester with an α-olefine compound is carried out. The alcohols having $R_1$ group should be suitably chosen in consideration of second order transition point and compatibility with the vinyl urethane compound and organic solvent of the α-olefine copolymer obtained.

The α-olefine copolymer produced from any of the abovementioned method has a number average molecular weight of about 40,000 to about 200,000 and may be used in the present invention as it is. However, the molecular weight of the α-olefine copolymer should preferably be from 55,000 to 170,000. If the molecular weight of the α-olefine copolymer is less than 40,000, the photocurable composition cannot be kept in the solid state at room temperature. On the other hand, with the α-olefine copolymer having the molecular weight of more than 200,000, the viscosity of the α-olefine copolymer is increased so that hindrance will be caused during the preparation of solid photosensitive layer on a substrate. The amount of the α-olefine copolymer to be added is generally in the range of 20 to 90% by weight, preferably 30 to 80% by weight, of the composition excepting the photosensitizer. When the amount is less than 20% by weight, the property keeping the photocurable composition at solid state at room temperature deteriorates and also it becomes difficult to wash out the photocurable composition with aqueous alkaline solution. On the other hand, when the amount to be added is more than 90% by weight, the curing property of the composition is reduced because the content of the vinylurethane compound described hereinafter is decreased, so that the curing by irradiation with actinic rays takes longer and the printing plate obtained becomes brittle.

The vinyl urethane compounds used for obtaining the photocurable composition of the present invention are obtained by urethanation reaction of a polyisocyanate compound with a photopolymerizable unsaturated alcohol or by urethanation reaction of 1 mole of diisocyanate compound with about 1 mole of the unsaturated alcohol and about 1/m mole of m-valent alcohol.

As the di- or polyisocyanate compounds, there are, for example, tolylene diisocyanates, xylylene diisocyanates, hexamethylene diisocyanate, lysine diisocyanate, isophorone diisocyanate, diphenyl methane-4,4′-diisocyanate, dicyclohexyl methane-4,4′-diisocyanate, triphenyl methane triisocyanate and compounds of the following formulae $H_5C_2C(CH_2OCONHC_6H_3CH_3NCO)_3$ and $OCN(CH_2)_6N[CONH(CH_2)_6NCO]_2$.

Various photopolymerizable ethylenically unsaturated alcohols with a number average molecular weight of less than 3,000 are known in the art and include, for example, allyl alcohol, monocrotonic acid esters of glycols, cinnamyl alcohol, oleyl alcohol, and monoacrylic acid or monomethacrylic acid esters of glycols. Of these, the monoacrylic acid or monomethacrylic acid esters of glycols which exhibit great photopolymerization activity are most suitable for the present invention, and are expressed by the following general formula:

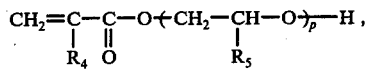

wherein $R_4$ and $R_5$ are independently hydrogen or methyl group and p is 1 or a greater integer which makes the number average molecular weight of the ester less than 3,000. Where $R_5$ is a methyl group, the recurring unit,

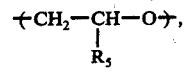

may be substituted with the unit,

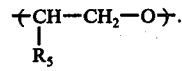

The use of an ethylenically unsaturated alcohol with a number average molecular weight of more than 3,000 is unfavorable since the reaction activity for formation of the urethane bond is so low that the reaction system should be treated at high temperature over a long period of time, and there being a possibility of gellation of the reaction system.

For the convenience sake, we will first describe the vinylurethane compound composed of binary components, a polyisocyanate and a photopolymerizable ethylenically unsaturated alcohol.

With regard to the reaction of polyisocyanate compound with the ethylenically unsaturated alcohol, it is preferred to make the isocyanate group of polyisocyanate compound to react with the ethylenically unsaturated alcohol in an amount of about 80% or more, preferably 95% or more.

In order to attain the above-mentioned reaction, the ethylenically unsaturated alcohol should be mixed with polyisocyanate compound in an equivalent or greater amount than the number of moles of the NCO group, followed by reaction at about 20° to 120° C for about 1 to 20 hours. Alternatively, the reaction may be effected by mixing the ethylenically unsaturated alcohol with polyisocyanate compound in an equivalent to or less amount than the number of moles of the NCO group, subjecting the mixture to reaction under the above-mentioned reaction conditions, and adding a balance of ethylenically unsaturated alcohol to the reaction system, followed by further reaction at room temperature or more.

If it is required to lower the reaction temperature or to shorten the reaction time, one or more urethanation catalysts may be added in an amount of 0.01 to 1% by weight of the reaction system and include, for example, tertiary amines such as triethylenediamine, triethylamine, tributylamine, benzyldimethylamine, triamylamine and the like, metal coordination compounds such as acetylacetone-iron (III) complex, acetylacetone-manganese (III) complex, acetylacetone-vanadium (III) complex and the like, basic metal carboxylates such as lithium benzoate, sodium propionate, sodium stearate, potassium oleate, and the like, alkyl metal compounds such as dibutyl tin dilaurate and the like, and metal alkoxides such as isopropyl titanate, n-butyl titanate and the like.

In order to avoid the gelation of the vinylurethane compound by thermal polymerization during preparation of the vinylurethane compound, it is desirable to add to the vinylurethane compound 0.001 to 1% by weight of a radical polymerization inhibitor such as hydroquinone, p-benzoquinone, 3,5-ditertiarybutylhydroxytoluene (hereinafter referred to as "BHT"), 2,2′-dimethyl-5,5′-ditertiary-butyl-4,4′-dihydroxyphenylthio ether, p-methoxyphenol, tert-butylcatechol, β-naphthol, pyrogallol, nitrobenzene, N-nitrose N-phenylhydroxyamine (cupferron), and metal salts thereof, Nitroso compounds such as N-nitroso-diphenyl amine, or the like.

The urethanation reaction may be effected in an organic solvent which does not impede the reaction, so as to reduce the viscosity of the reaction system for making the reaction to proceed smoothly. Examples of the solvents include organic solvents having no active hydrogen atom such as ketones for example, acetone, methyl ethyl ketone, esters for example, ethyl acetate and isobutyl acetate, ethers for example, ethylene glycol monomethyl ether and hydrocarbons for example, benzene and toluene. Further, an ethylenically unsaturated liquid monomer capable of free radical polymerization is utilizable instead of the organic solvent, and may be used, as it is, as one component of the photocurable composition for copolymerization with the vinylurethane compound by irradiation of actinic ray. The ethylenically unsaturated liquid monomers useful for this purpose are, for example, aromatic vinyl monomers such as styrene, vinyltoluene, divinylbenzene and the like, acrylic esters such as methyl acrylate, ethyl acrylate, isopropyl acrylate, n-butyl acrylate, isobutyl acrylate, 2-ethylhexyl acrylate, lauryl acrylate, ethylene glycol diacrylate, propylene glycol diacrylate, polyethylene glycol diacrylate, glycidyl acrylate and the like, methacrylic esters such as methyl methacrylate, ethyl methacrylate, isopropyl methacrylate, n-butyl methacrylate, isobutyl methacrylate, lauryl methacrylate, ethylene glycol dimethacrylate, polyethylene glycol dimethacrylate, trimethylolpropane trimethacrylate, glycidyl methacrylate and the like, allyl esters such as diallyl phthalate, fumaric acid esters such as diethyl fumarate and the like, and acrylonitrile.

The vinylurethane compound thus prepared may be mixed with an organic solvent or a polymerizable ethylenically unsaturated monomer, if desired. In this case, it is possible to employ an organic solvent having active hydrogen atom such as an alcohol or an amine which is reactive with the NCO group of the vinylurethane compound as well as the above-indicated solvents. The ethylenically unsaturated monomers are vinyl monomers having active hydrogen reactive with the NCO group and include, for example, acrylic acid, methacrylic acid, 2-hydroxyethyl methacrylate, hydroxypropyl methacrylate, N,N-diethylaminoethyl methacrylate, acrylamide and the like as well as those defined hereinbefore.

The present invention has been illustrated hereinabove with regard to the vinylurethane compound composed of the binary reaction components. We will describe another embodiment of the vinylurethane compound which is obtained from ternary compounds, i.e., 1 mole of diisocyanate compound, about 1 mole of a photopolymerizable ethylenically unsaturated alcohol having a number average molecular weight of less than 3,000, and about $1/m$ mole of an m-valent alcohol (wherein $m$ is an integer of from 2 to 6) having a number average molecular weight of less than 3,000. The m-valent alcohol is used for imparting flexibility to the resulting vinylurethane compound by increasing the molecular weight of the vinylurethane compound in a linear form and for increasing the polyfunctionality of the vinylurethane compound to enhance photocurability. Furthermore, the use of the m-valent alcohol is effective for improving mechanical properties of a cured printing plate.

The use of polyhydric alcohols exceeding hexavalent unfavorably tends to cause gelation during preparation or storage. With polyhydric alcohols having a number average molecular weight of more than 3,000, a uniform reaction is made difficult due to increased viscosity of the reaction system and the reactivity of the polyhydric alcohol per se with the diisocyanate is reduced, thus requiring undesirable reaction conditions of high temperature and long period of time.

Examples of the divalent to hexavalent alcohols suitable for the purpose of the invention include:

(1) ethylene glycol, (2) 1,2-propanediol (propylene glycol), (3) 1,3-propandiol, (4) neopentyl glycol (2,2-dimethylpropanediol), (5) 1,2-butanediol, (6) 1,3-butanediol, (7) 1,4-butanediol, (8) 2,3-butanediol, (9) 1,5-pentanediol, (10) 1,6-hexanediol, (11) 2-methylpentane-2,4-diol, (12) polyethylene glycol with a number average molecular weight below 3,000, (13) polypropylene glycol with a number average molecular weight below 3,000, (14) glycerine, (15) trimethylolethane (1,1,1-trishydroxymethylethane), (16) trimethylolpropane (1,1,1-trishydroxymethylpropane), (17) pentaerythritol, (18) pentavalent sugaralcohols such as D-arabitol, L-arabitol, adonitol and xylitol, (19) hexavalent sugaralcohols such as D- or L-sorbitol, D- or L-manitol, D- or L-iditol, D- or L-talitol, dalsitol and aritol, (20) a polyaddition product of ethylene oxide to glycerine (with a number average molecular weight below 3,000), (21) a polyaddition product of propylene oxide to glycerine (with an average number molecular weight below 3,000), (22) a polyaddition product of ethylene oxide to trimethylolethane (with a number average molecular weight below 3,000), (23) a polyaddition product of propylene oxide to trimethylolethane (with a number average molecular weight below 3,000), (24) a polyaddition product of ethylene oxide to D-sorbitol, etc., (with a number average molecular weight below 3,000), (25) a polyaddition product of propylene oxide to D-sorbitol, etc., (with a number average molecular weight below 3,000), (26) dipentaerythritol, (27) polybutadiene glycol (with a number average molecular weight below 3,000), (28) triricinoleic acid ester of glycerine, (29) polyester glycol (with a number average molecular weight below 3,000) and polytetramethylene glycol (with a number average molecular weight below 3,000).

The reaction of diisocyanate compound, the ethylenically unsaturated alcohol and the divalent to hexavalent alcohol may be effected typically at a ratio $1:1:1/m$ (wherein $m$ is the number of valence of the last-mentioned alcohol). However, it is not necessarily required to exactly react the diisocyanate compound with the two alcohols at the above-mentioned ratio. The reaction may be stopped before completion. That is, a part, for example, less than 30% of the ethylenically unsaturated alcohol may remain unreacted. Further, even though a part, for example, less than 20% of the NCO group remains unreacted after the preparation of the vinylurethane compound, no hindrance will be caused if the unreacted NCO group is reduced within several percent by adding to the vinylurethane compound the afore-mentioned polymerizable ethylenically unsaturated monomer or organic solvent which has an active hydrogen atom. It is not also required to completely urethanate the OH group of the divalent to hexavalent alcohol.

In this ternary vinylurethane compound, the aforementioned reaction conditions, urethanation catalysts, polymerization inhibitors, organic solvents, and ethylenically unsaturated liquid monomers capable of free radical polymerization can be also employed in the same manner. The reaction may be effected by any of the following procedures: diisocyanate compound is made to react first with a polyhydric alcohol and then with an ethylenically unsaturated alcohol; diisocyanate compound is made to react with first an ethylenically unsaturated alcohol and then a polyhydric alcohol; and the three components are subjected to reaction at the same time.

The amount to be used of the vinylurethane compound thus prepared is inevitably in the range of 10 to 80% by weight, preferably 20 to 70% by weight of the photocurable composition excepting the photosensitizer. The use of less than 10% by weight causes a decrease of photocurability such that it is not effective for forming the printing plate. When the amount is more than 80% by weight, it is impossible to maintain the photocurable composition in the solid state at room temperature and also it becomes difficult to wash out the composition with aqueous alkaline solution.

Then, the photosensitizer as indicated hereinafter is added to the photocurable composition to complete the present invention. The amount of the photosensitizer is generally in the range of 0.1 to 5% by weight, preferably 0.1 to 2% by weight, of the composition. Examples of the photosensitizer useful in the present invention include: $\alpha$-carbonyl alcohols such as benzoin, butyroin, trioin, acetoin, acroin and the like; acyloin ethers such as benzoin methyl ether, benzoin ethyl ether, benzoin isopropyl ether, pivaloin ethyl ether, anisoin ethyl ether, and the like; $\alpha$-substituted acyloin such as $\alpha$-methylbenzoin, $\alpha$-phenylbenzoin and the like; polynuclear quinones such as 9,10-anthraquinone, 2-chloroanthraquinone, 2-methylanthraquinone, 1,4-naphthoquinone, 2,3-benzanthraquinone, and the like; neighboring polyketone compounds such as diacetyl, dibenzoyl, diphenyltriketone, phenylglyoxal, pentanedio-2,3 and the like; mercaptans such as 2-mercaptobenzothiazole, 2-mercaptobenzooxazole, 2-mercaptonaphthooxazole, 2-mercaptobenzoimidazole and the like; disulfides such as diphenyl disulfide; dibenzyl disulfide, di-n-butyl disulfide, dibenzoyl disulfide, diacetyl disulfide, dibornyl disulfide and the like; thiols such as thiophenol, o-aminothiophenol and the like; thiuram derivatives such as tetramethylthiuram monosulfide, tetramethylthiuram disulfide, tetramethylthiuram tetrasulfide, and the like; metal complexes such as acetylacetone nickel complex and the like; peroxides such as benzoyl peroxide, di-tert-butyl peroxide and the like; phenylketones such as benzophenone, Michler's ketone, $\omega$-bromoacetophenone and the like; aromatic sulfonyl chlorides such as 1-naphthalenesulfonyl chloride and the like; and metal mercaptides such as mercury phenylmercaptide and the like.

Of the photosensitizers defined, the $\alpha$-carbonyl alcohols, $\alpha$-substituted acyloins and acyloin ethers are most suitable since the same are excellent in solubility in the photocurable composition.

Further, to the photocurable composition of the invention other additives such as pigments, dyes and fillers may be added and dispersed as long as they do not so much decrease the photocurability of the composition. Also, the radical polymerization inhibitor described hereinbefore may be added to the photocurable composition in order to avoid the gelation by thermal polymerization.

The photocurable composition of the present invention is very suitable for use in a seal, a photoresist for etching or a ornamental molding material in addition to a printing plate, and can be completely cured by irradiation of even a small quantity of actinic rays. The resultant cured product is extremely excellent in mechanical strength and water and chemical resistance. Further, the photocurable composition of the invention may be completely cured without treating it under anaerobic conditions. The actinic rays are those having a wavelength of 200 m$\mu$ to 800 m$\mu$. Almost any light sources may be used without limitation, including a low pressure mercury lamp, a high pressure mercury lamp, a carbon arc lamp, a xenone lamp, a tungsten lamp, a fluorescent lamp for chemical purpose, sun light, laser light, and the like, by which the photocurable composition applied can be completely cured by irradiation for 0.1 – 100 minutes in general cases. When used as an image-forming layer, the composition of the invention is generally molded into a 0.01 – 10 mm thick layer in solid form, which is then exposed to light through an image pattern by the use of any of the above-mentioned light sources for selectively curing the image areas. Nonexposed or non-cured areas are generally dissolved out by organic solvent or alkali aqueous solution. A surface active agent aqueous solution or other developing means may be also employed. As the alkali aqueous solutions, there are, for example, aqueous ammonia, alkali metal hydroxide aqueous solutions, aqueous solutions of alkali metal salts such as carbonates, bicarbonates and acetates, aqueous solutions of organic amines such as ethanolamine, diethanolamine and triethanolamine. These alkali aqueous solution are used in concentration of 0.01 to 10% by weight, conventionally less than 5% by weight. As the organic solvent, there are, for example, methanol and ethanol.

The present invention will be particularly illustrated by way of the following examples, which should not be construed as limiting thereto the present invention.

EXAMPLE 1

To a 5 liter three neck flask with a stirrer, a reflux condenser and a thermometer were added 900g of copolymer of maleic anhydride with isobutylene having a number average molecular weight of 5.5–6.5 $\times$ $10^4$ (a product of Kuraray Co., Ltd., Japan, which is commercially available as trade name "ISOBAM-04") and 2100g of butanol. Then, the contents were heated to cause halfesterification at 180° C. Thus, after 9 hours, a half-esterified product (hereinafter referred to as "$\alpha$-olefine copolymer I") of the copolymer "ISOBAM-04" was prepared. The resultant $\alpha$-olefine copolymer I was washed five times with n-hexane solution and then dried for 40 hours in vacuum desiccator heated to 100° C. The degree of ring-opening reaction was 97%, which was measured by acid value.

In the next step, 260g (2 moles) of 2-hydroxyethyl methacrylate (hereinafter referred to as "HEMA") to which was added 104 mg of 3,5-di-tert-butylhydroxy toluene (hereinafter referred to as "BHT") was introduced into a 1 liter flask, to which was further added and dissolved 52 mg of triethylenediamine, followed by heating to 80° C. Then, 262g (1 mole) of 4,4'-dicyclohexyl methane diisocyanate (a product of E. I. DuPont De Nemours & Co., Inc., U.S.A., which product is commercially available as trade mark "Hylen W") was dropped into the reaction system over a period of about 30 minutes, followed by urethanation reaction at 80° C for about 3 hours to obtain a vinylurethane compound I. The degree of reaction was about 88% when determined by measuring a residual isocyanate value (i.e., predetermined excess of di-n-butylamine was introduced into a predetermined amount of the reaction solution for reaction with a residual NCO group and the unreacted amine was quantitatively determined by back titration using hydrochloric acid).

Then, 60g of the α-olefine copolymer I, 40g of the vinylurethane compound I and 1g of benzoin methyl ether were dissolved into 70g of acetone to obtain a photocurable composition.

This photocurable composition was applied to a primer-coated metal plate of 0.3 mm thickness by means of an applicator and kept in a dark place for 72 hours at a room temperature to remove the solvent. Thus, a photosensitive plate having a film thickness of 0.6 mm was obtained by press molding of the photocurable composition.

Then, a negative film was closely contacted to the above photosensitive plate, and the photosensitive plate was irradiated for 5 minutes by means of a low pressure mercury lamp ("Model FL-20BL" produced by Tokyo Shibaura Electric Co., Ltd.) located at a distance of 12 cm from the plate and developed for 3 minutes with a 0.3% sodium hydroxide aqueous solution (solution temperature: 20° C), followed by postirradiation for 2 minutes to obtain a relief printing plate which was excellent in reproducibility and printing durability (ensuring 500,000 or more printing pass operation).

Also, this relief printing plate was rolling-pressed onto a wet paper matrix to obtain a pattern plate with excellent reproducibility and sharpness. The production of at least 20 pattern plates was possible without any change of the reproducibility since the relief printing plate had excellent hardness (about 87 degrees at 23° C by the scale of the Shore hardness tester specified by ASTM D-2240-68) and water resistance.

EXAMPLE 2

212g (1 mole) of lysin diisocyanate was dropped into 540g (about 2 moles) of polyethylene glycol monomethacrylate (having a number average molecular weight of the polyethylene glycol moiety of about 200, and containing 152 mg BHT) for reaction at 80° C for 5 hours to obtain vinylurethane compound II. The degree of reaction of the NCO group was about 90%.

50g of the resultant vinylurethane compound II was mixed with 50g of the α-olefine copolymer I obtained in Example 1, 1g of benzoin isobutyl ether and 0.05g of cupferron. The resultant mixture was uniformly kneaded for 30 minutes by means of a pair of hot rolls each having a surface temperature of 130° C to obtain a photocurable composition. This composition was press molded on a primer-coated polyester sheet of 0.25 mm thickness in such a manner that a photosensitive layer was formed in a thickness of 0.6 mm to obtain a photosensitive sheet.

Then, a negative film was closely contacted to the above photosensitive sheet, which was irradiated for 4 minutes by means of the low pressure mercury lamp used in Example 1 and developed for 3 minutes with a 0.3% sodium hydroxide aqueous solution, followed by postirradiation for 2 minutes to obtain a relief printing plate which was excellent in reproducibility, flexibility and printing durability (ensuring 500,000 or more printing pass operation).

EXAMPLE 3

To a 2 liter three neck flask with a stirrer, a reflux condenser and a thermometer were added 250g of copolymer of maleic anhydride with isobutylene having a number average molecular weight of $8 - 9 \times 10^4$ (a product of Kuraray Co., Ltd., Japan, which is commercially available as trade name "ISOBAM-06"), 750g of ethanol and 6g of pyridine. Then, the contents were heated to cause half-esterification at 78° C. Thus, after 16 hours, a half-esterified product (hereinafter referred to as "α-olefine copolymer II") of the copolymer "ISOBAM-06" was prepared. The resultant α-olefine copolymer II was washed five times with n-hexane solution and then dried for 40 hours in vacuum desiccator heated at 100° C. The degree of ring-opening reaction was 94%, which was measured by acid value.

In the next step, 100g of the dried α-olefine copolymer II, 30g of vinylurethane compound I obtained in Example 1 and 0.6g of benzoin were dissolved into 100g of acetone to obtain a photocurable composition.

This photocurable composition was applied to a grained aluminum plate by means of an applicator and kept in a dark place for 24 hours at a room temperature to remove the solvent. Thus, a photosensitive plate for lithography having a film thickness of 20μ was obtained.

Then, a negative film was closely contacted to the above photosensitive plate, which was irradiated for 30 seconds by means of the low pressure mercury lamp used in Example 1 at a distance of 12 cm and developed for 20 seconds with a 0.3% sodium hydroxide aquious solution to obtain a printing plate for lithgraphy which was excellent in reproducibility and printing durability.

EXAMPLE 4

In the first reaction stage, 200g (1 mole) of polyethylene glycol having a number average molecular weight of about 200 was subjected to urethanation reaction with 424g (2 mole) of lysin diisocyanate in a nitrogen flow at 110° C for 2 hours. Then, 260g (2 moles) of HEMA containing 104 mg of BHT was dropped into the reaction system over a period of about 30 minutes, followed by urethanation reaction in air at 80° C for 5 hours to obtain a vinylurethane compound II. The degree of reaction of the NCO group was about 85%.

Then, 60g of the α-olefine copolymer I obtained in Example 1, 40g of the vinylurethane compound II and 1g of benzoin methyl ehter were dissolved into 70g of acetone to obtain a photocurable composition.

This photocurable composition was applied to a primercoated metal plate of 0.3 mm thickness by means of an applicator and kept in a dark place for 72 hours at a room temperature to remove the solvent. A photosensitive plate having a film thickness of 0.6 mm was obtained by press molding of the photocurable composition.

Then, a negative film was closely contacted to the above photosensitive plate, and the photosensitive plate was irradiated for 4 minutes by means of the low pressure mercury lamp used in Example 1 at a distance of 12 cm from the plate and developed for 3 minutes with a 0.3% sodium hydroxide aqueous solution, followed by postirradiation for 2 minutes to obtain a relief printing plate which was excellent in reproducibility and printing durability (ensuring 500,000 or more printing pass operation).

Also this relief printing plate was rolling-pressed onto a wet paper matrix to obtain a pattern plate with excellent reproducibility and sharpness. The production of at least 20 pattern plates was possible without any change of the reproducibility since the relief printing plate had excellent hardness (about 85 degrees at 23° C by the scale of the Shore hardness tester specified by ASTM D-2240-68) and water resistance.

EXAMPLE 5

In the first reaction stage, 400g (1 mole) of polyethylene glycol having a number average molecular weight of about 400 was subjected to urethanation with 444g (2 moles) of isophorone diisocyanate (a product of Veba Chemie A.G., West Germany) in a nitrogen flow at 100° C for 2.5 hours. Then, 288g (2 moles) of hydroxypropyl methacrylate containing 266 mg of BHT and 113 mg of triethylenediamine was dropped into the reaction system over a period of about 30 minutes, followed by urethanation reaction in air at 80° C for 4 hours to obtain a vinylurethane compound III. The degree of reaction of the NCO group was 87%.

50g of the resultant vinylurethane compound III was mixed with 50g of the α-olefine copolymer I obtained in Example 1, 1g of benzoin isobutyl ether and 0.05g of cupferron. The resultant mixture was uniformly kneaded for 30 minutes by means of a pair of hot rolls each having a surface temperature of 130° C to obtain a photocurable composition. This composition was press molded on a primer-coated polyester sheet of 0.25 mm thickness in such a manner that a photosensitive layer was formed in a thickness of 0.6 mm to obtain a photosensitive sheet.

Then, a negative film was closely contacted to the above photosensitive sheet, which was irradiated for 4 minutes by means of the low pressure mercury lamp used in Example 1 and developed for 3 minutes with 0.3% sodium hydroxide aqueous solution, followed by postirradiation for 2 minutes to obtain a relief printing plate which was excellent in reproducibility, flexibility and printing durability (ensuring 500,000 or more printing pass operation).

EXAMPLE 6

Into 100g of acetone were dissolved 100g of the α-olefine copolymer II obtained in Example 3, 30g of the vinylurethane compound II obtained in Example 4 and 0.6g of benzophenone to obtain a photocurable composition.

This composition was applied to a grained aluminum plate by means of an applicator and kept in a dark place for 24 hours at room temperature to remove the solvent. Thus, a photosensitive plate for lithography having a film thickness of 20μ was obtained.

Then, a negative film was closely contacted to the above photosensitive plate, which was irradiated for 30 seconds and developed for 20 seconds in the same procedure as in Example 1 to obtain a printing plate for lithography which was excellent in reproducibility and printing durability.

EXAMPLE 7

In the first reaction stage, 780g (3 moles) of 4,4'-dicyclohexyl methane diisocyanate was subjected to urethanation reaction with 350g (0.5 mole) of "New Pole S-P" (the trade mark of an addition product of propylene oxide to sorbitol produced by Sanyo Chemical Industries Ltd., Japan and having a number average molecular weight of about 700) in a nitrogen flow at 110° C for 3 hours. Then, in the second stage, 392g of tetraethylene glycol dimethacrylate was added to the reaction system for dilution, to which was further added 432 g (3 moles) of hydroxypropyl methacrylate which contained 150 mg of p-benzoquinone and 6 g of potassium oleate, for reaction in air at 90° C for 3 hours whereby a vinylurethane compound IV having the degree of reaction of the NCO group of 86% was obtained. Into 100g of acetone were dissolved 100g of the α-olefine copolymer II obtained in Example 3, 30 g of the vinylurethane compound IV and 0.6 g of benzophenone to obtain a photocurable composition.

This photocurable composition was applied to a grained aluminum plate and dried in the same manner as in Example 6 to obtain a photosensitive plate for lithography having a film thickness of 20μ.

Then, a negative film was closely contacted to the above photosensitive plate for lithography, which was irradiated for 20 seconds, followed by developing for 20 seconds in the same procedure as in Example 1 to obtain a printing plate for lithography which was excellent in reproducibility and printing durability.

EXAMPLE 8

Into 40 g of the vinylurethane compound III obtained in Example 5 were dissolved 100g of the α-olefine copolymer II obtained in Example 3, 0.6 g of tetramethyldiaminobenzophenone (Michler's ketone) and 0.01 g of hydroquinone to obtain a photocurable composition.

This photocurable composition was applied to a silk screen by immersion method and dried in a dark place for 24 hours at a room temperature, followed by a drier for 5 hours at 80° C to obtain a photosensitive material for silk screen.

Then, a positive film was closely contacted to the above photosensitive material, which was irradiated for 50 seconds by means of the low pressure lamp used in Example 1 and developed for 30 seconds with a 0.3% sodium hydroxide aqueous solution to obtain a silk screen printing plate which was excellent in reproducibility and flexibility.

EXAMPLE 9

In the first reaction stage, 400 g (1 mole) of polyethylene glycol having a number average molecular weight of about 400 and 1,000 g (1 mole) of polyethylene glycol having a number average molecular weight of about 1,000 were subjected to urethanation reaction with 696 g (4 moles) of tolyene diisocyanate in a nitrogen flow at 80° C for 1 hour and further at 100° C for 30 minutes. Then, 1,300 g (10 moles) of HEMA containing 340 mg of BHT was added to the reaction system, followed by urethanation reaction in air at 60° C for 2 hours and further at 80° C for 2 hours to obtain an HEMA solution of vinylurethane compound V having a solid content of about 77% by weight. The degree of reaction of the NCO group was about 100%.

50g of the α-olefine copolymer I obtained in Example 1, 50 g of the vinylurethane compound V solution and 1 g of benzoin methyl ether were dissolved into 70g of acetone to obtain a photocurable composition.

Then, a relief printing plate was prepared in the same procedure as in Example 1 except that irradiation of 8 minutes, development of 4 minutes and postirradiation of 2 minutes were carried out. The resultant relief printing plate was excellent in reproducibility and printing durability (ensuring 500,000 or more printing pass operation).

EXAMPLE 10

To a 3 liter three neck flask were added 500 g of acetone and 656 g (1 mole) of Desmodur L (trade mark of triisocyanate compound produced by Bayer A.G., West German). The contents were heated to 56° C. Then, 390g (3 moles) of HEMA containing 105 mg was dropped into the reaction system over a period of about 1 hour, followed by urethanation reaction in air at 56° C for 3 hours to obtain a vinylurethane compound VI solution having a solid content of about 68% by weight. The degree of reaction of the NCO group was about 92%.

10g of the vinylurethane compound VI solution was mixed with 10g of the α-olefine copolymer II obtained in Example 3 and 0.15 g of benzoin isobutyl ether to obtain a photocurable composition.

Then, a printing plate for lithography was prepared in the same procedure as in Example 3 except that irradiation was carried out for 40 seconds. The resultant plate was excellent in reproducibility and durability.

EXAMPLE 11

30 g of the α-olefine copolymer I obtained in Example 1, 70 g of the vinylurethane compound I obtained in Example 1 and 1 g of benzoin methyl ether were dissolved into 70 g of acetone to obtain a photocurable composition.

Then, a relief printing plate was prepared in the same procedure as in Example 1 except that irradiation of 3 minutes and development of 8 minutes were carried out. The resultant relief printing plate was of practical use.

What is claimed is:

1. A photocurable composition which comprises (A) a mixture of 20 to 90% by weight of a maleic acid monoester/α olefine copolymer of the formula:

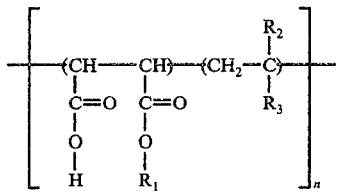

wherein $R_1$ is an alkyl group having 1 to 8 carbon atoms, aralkyl group, cyclo group and cycloalkyl group, $R_2$ is a hydrogen or alkyl group of 1 to 3 carbon atoms, $R_3$ is a hydrogen or alkyl group of 1 to 6 carbon atoms and $n$ is an integer which provides a number average molecular weight of 55,000 to 200,000 and 10 to 80% by weight of a vinylurethane compound obtained by urethanation reaction of a polyisocyanate compound with a photopolymerizable ethylenically unsaturated alcohol having a number average molecular weight of less than 3,000 or by urethanation reaction of 1 mole of diisocyanate compound with about 1 mole of said photopolymerizable ethylenically unsaturated alcohol and about 1/m mole of m-valent alcohol (wherein $m$ is an integer of 2 to 6) having a number average molecular weight of less than 3,000, and (B) a photosensitizer.

2. A photocurable composition according to claim 1, wherein said α-olefine compound is selected from the group consisting of ethylene, propylene, n-butene, isobutylene, n-pentene, isoprene, 2-methyl 1-butene, n-hexene, 2-methyl 1-pentene, 3-methyl 1-pentene, 4-methyl 1-pentene and 2-ethyl 1-butene.

3. A photocurable composition according to claim 2, wherein said α-olefine compound is isobutylene.

4. A photocurable composition according to claim 1, wherein said di- or polyisocyanate compound is selected from the group consisting of tolyene diisocyanates, xylylene diisocyanates, hexamethylene diisocyanate, lysine diisocyanate, isophorone diisocyanate, diphenyl methane-4-4'-diisocyanate, dicyclohexyl methane-4,4'-diisocyanate, triphenyl methane triisocyanate and compounds of the following formulae $H_5C_2C(CH OCONHC_6H_3\ CH_3NCO)_3$ and $OCN(CH_2)_6N[CONH(CH_2)_6NCO]_2$.

5. A photocurable composition according to claim 1, wherein said photopolymerizable ethylenically unsaturated alcohol is selected from the group consisting of monocrotonic acid esters of glycols, cinnamyl alcohol, oleyl alcohol, and monoacrylic acid and monomethacrylic acid esters of glycols.

6. A photocurable compsotion according to claim 5, wherein said photopolymerizable ethylenically unsaturated alcohol is monoacrylic acid or monomethyacrylic acid esters of glycols of the general formula

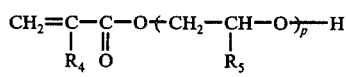

wherein $R_4$ and $R_5$ are independently hydrogen or methyl group and $p$ is 1 or more integer which provides a the number average molecular weight of less than 3,000.

7. A photocurable composition according to claim 1, wherein said m-valent alcohol is selected from the group consisting of ethylene glycol, 1,2-propanediol, 1,3-propanediol, neopentyl glycol, 1,2-butanediol, 1,3-butanediol, 1,4-butanediol, 2,3-butanediol, 1,5-pentanediol, 1,6-hexanediol, 2-methylpentane-2,4-diol, polyethylene glycol with a number average molecular weight below 3,000, polypropylene glycol with a number average molecular weight below 3,000, glycerine, trimethylol ethane, trimethylol propane, pentaerythritol, pentavalent sugaralcohol consisting of D-and L-arabitols, adonitol and xylitol, hexavalent sugaralcohols consisting of D- and L-sorbitols D-and L-manitols, D- and L-iditols, D- and L-talitols, dalsitol and sllitol, a polyaddition product of ethylene oxide to glycerine with a number average molecular weight of less than 3,000, a polyaddition product of propylene oxide to glycerine with a number average molecular weight below 3,000, a polyaddition product of ethylene oxide to trimethylol ethane with a number average molecular weight below 3,000, a polyaddition product of ethylene oxide to D-sorbitol with a number average molecular weight below 3,000, dipentaerythritol, polybutadiene glycol with a number average molecular weight below 3,000 triricinoleic acid ester of glycerine and polyester glycol with a number average molecular weight below 3,000 and polytetramethylene glycol (with a number average molecular weight below 3,000).

8. A photocurable composition according to claim 1, wherein said photosensitizer is selected from the group consisting of α-carbonyl alcohols consisting of benzoin, butyroin, trioin, acetoin and acroin; acyloin ethers consisting of benzoin methyl ether, benzoin ethyl ether, benzoin isopropyl ether, pivaloin ethyl ether, and anisoin ethyl ether; α-substituted acyloins consisting of α-methylbenzoin, and α-phenylbenzoin; polynuclear quinones consisting of 9,10-anthraquinone, 2-chloroanthraquinone, 2-methylanthraquinone, 1,4-naphthoquinone, and 2,3-benzanthraquinone; neighboring polyketone compounds consisting of diacetyl, dibenzoyl, diphenyltriketone, phenylglyoxal, and pentadion-2,3; mercaptans consisting of 2-mercaptobenzothiazole, 2-mercaptobenzooxazole, 2-mercaptonaphthooxazole, and 2-mercaptobenzoimidazole; disulfides consisting of diphenyl disulfide, dibenzyl disulfide, di-n-butyl disulfide, dibenzoyl disulfide, diacetyl disulfide, and dibornyl disulfide; thiols consisting of thiophenol and o-aminothiophenol; thiuram derivatives consisting of tetramethylthiuram monosulfide, tetramethylthiuram disulfide and tetramethylthiuram tetrasulfide; a metal complex consisting of acetylacetone nickel complex; and peroxides consisting of benzoyl peroxide and di-tert-butyl peroxide; phenylketones consisting of benzophenone, Michler's ketone and ω-bromoacetophenone; an aromatic sulfonyl chloride consisting of 1-naphthalenesulfonyl chloride; and a metal mercaptide consisting of mercury phenylmercaptide.

9. A photocurable composition according to claim 8, wherein said photosensitizer is used in an amount of 0.01 to 5% by weight of said composition.

10. The photocurable composition according to claim 1 wherein said photosensitizer is 0.01 to 5 percent by weight of the composition.

11. A photocurable composition according to claim 10 wherein said mixture is of 30-80 weight perecent of said copolymer of 20-70 weight percent of said vinylurethane compound, wherein said copolymer has a number average molecular weight of 55,000–170,000, and wherein said photosensitizer is 0.1-2 weight percent.

* * * * *